:::page-header
US011563038B2
:::

(12) United States Patent
Wang

(10) Patent No.: US 11,563,038 B2
(45) Date of Patent: Jan. 24, 2023

(54) DISPLAY PANEL, MANUFACTURING METHOD AND REPAIR METHOD THEREOF

(71) Applicant: Wuhan China Star Optoelectronics Semiconductor Display Technology Co., Ltd., Wuhan (CN)

(72) Inventor: Lei Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 192 days.

(21) Appl. No.: 16/956,592

(22) PCT Filed: Dec. 2, 2019

(86) PCT No.: PCT/CN2019/122365
§ 371 (c)(1),
(2) Date: Jun. 21, 2020

(87) PCT Pub. No.: WO2021/022733
PCT Pub. Date: Feb. 11, 2021

(65) Prior Publication Data
US 2022/0139969 A1 May 5, 2022

(30) Foreign Application Priority Data
Aug. 6, 2019 (CN) .......................... 201910723258.7

(51) Int. Cl.
*H01L 27/12* (2006.01)
(52) U.S. Cl.
CPC ...... *H01L 27/1244* (2013.01); *H01L 27/1218* (2013.01); *H01L 27/1259* (2013.01)
(58) Field of Classification Search
CPC ......... H01L 51/0097; H01L 2251/5338; H01L 27/1244; H01L 27/3276
See application file for complete search history.

(56) References Cited

U.S. PATENT DOCUMENTS

| | | | |
|---|---|---|---|
| 10,263,063 | B2 | 4/2019 | Yamazaki et al. |
| 2015/0325809 | A1 | 11/2015 | Yoshida et al. |

FOREIGN PATENT DOCUMENTS

| | | |
|---|---|---|
| CN | 101189724 | 5/2008 |
| CN | 107994058 | 5/2018 |

(Continued)

OTHER PUBLICATIONS

M. D. Dickey et al., "Eutectic Gallium-Indium (EGaIn): A Liquid Metal Alloy for the Formation of Stable Structures in Microchannels at Room Temperature," Advanced Functional Materials, vol. 18, pp. 1097-1104, published online Mar. 20, 2008. (Year: 2008).*

*Primary Examiner* — Peter M Albrecht
(74) *Attorney, Agent, or Firm* — PV IP PC; Wei Te Chung; Ude Lu

(57) ABSTRACT

A display panel, a manufacturing method and a repair method thereof are provided. The display panel includes a flexible substrate and a plurality of bent traces. The flexible substrate includes a display portion, a bent portion, and a bezel portion being arranged in order. The bezel portion and the display portion are stacked through a bending in the bent portion. The bent portion is provided with the plurality of bent traces. Material of the bent traces includes a first material, and the first material is a conductive material having a melting point lower than 250° C. By adding the first material with the low melting point to the bent traces, when the bent traces are broken, the first material can be melted to flow by heating, thereby repairing the broken traces among the bent traces, whereby realizing the self-repair of the bent traces, increasing the process yield and reducing the production loss.

3 Claims, 6 Drawing Sheets

(56) References Cited

FOREIGN PATENT DOCUMENTS

| | | | |
|---|---|---|---|
| CN | 108777914 | | 11/2018 |
| CN | 109300405 | | 2/2019 |
| CN | 109300405 A | * | 2/2019 |

* cited by examiner

DISPLAY PANEL, MANUFACTURING METHOD AND REPAIR METHOD THEREOF

RELATED APPLICATIONS

This application is a National Phase of PCT Patent Application No. PCT/CN2019/122365 having International filing date of Dec. 2, 2019, which claims the benefit of priority of Chinese Patent Application No. 201910723258.7 filed on Aug. 6, 2019. The contents of the above applications are all incorporated by reference as if fully set forth herein in their entirety.

FIELD AND BACKGROUND OF THE INVENTION

The present disclosure relates to a technical field of display, and more particularly to a display panel, a manufacturing method and a repair method thereof.

A flat display device has many advantages, such as a thin body, power conservation, and no radiation, and has been widely used. The existing flat display device mainly includes a liquid crystal display device (LCD) and an organic light emitting diode (OLED) display devices.

Most of the liquid crystal display devices are backlight type liquid crystal displays, which include a liquid crystal display panel and a backlight module. The working principle of the liquid crystal display panel is in that liquid crystal molecules are placed in two parallel glass substrates, there are many tiny vertical and horizontal wires in the middle of the two glass substrates, the liquid crystal molecules are controlled to change directions by applying electricity or not, and the light of the backlight module is refracted out to generate an image.

The OLED display device generally includes a substrate, an anode disposed on the substrate, an organic light emitting layer disposed on the anode, an electron transport layer disposed on the organic light emitting layer, and a cathode disposed on the electron transport layer. During operation, holes from the anode and electrons from the cathode are emitted to the organic light emitting layer, these electrons and holes are combined to generate excited electron-hole pairs, and the excited electron-hole pairs are converted from the excited state to the ground state, thereby emitting light.

No matter LCD or OLED, the current mainstream development trends are large screens and narrow bezels. The key technology of the narrow bezel is pad bending. Its principle is that the non-display area on the periphery of the display panel is bent to the back of the display, thereby narrowing the bezel. Although the pad bending technology can significantly reduce the size of the bezel, it also faces a problem of low yield. This is because the metal traces in the bent area are prone to crack. In the serious cases, fractures may occur, such that electrical signals cannot to be transformed normally inside the display. In addition, as the bending radius of the pad bending is further reduced, the phenomenon of wire fractures in the bent area becomes more prominent. How to avoid or repair the wire fractures in the bent area has become a hot issue that needs to be solved currently.

SUMMARY OF THE INVENTION

The object of the present disclosure is to provide a display panel, which can realize self-repair of bent traces, increase the process yield, and reduce the production loss.

The object of the present disclosure is also to provide a manufacturing method of a display panel. The manufactured display panel can realize self-repair of bent traces, increase the process yield, and reduce production loss.

The object of the present disclosure is also to provide a repair method of a display panel, which can realize self-repair of bent traces, increase the process yield, and reduce production loss.

To achieve the above object, the present disclosure provides a display panel including: a flexible substrate and a plurality of bent traces; the flexible substrate including a display portion, a bent portion, and a bezel portion being arranged in order; the bezel portion and the display portion being stacked through a bending of the bent portion; the bent portion being provided with the plurality of bent traces, material of the bent traces including a first material, and the first material being a conductive material having a melting point lower than 250° C.

Each of the bent traces includes a plurality of first trace layers and a plurality of second trace layers; the second trace layers are formed on the bent portion, the bent portion and each of the second trace layers are covered by an organic insulating layer, the organic insulating layer corresponding to each of the second trace layers is provided with two grooves respectively exposing the two side edges of each of the second trace layers, and the first trace layers are formed in the grooves; and material of the first trace layer is the first material.

Each of the bent traces only includes the first trace layers, and the first trace layers are formed on the bent portion; the bent portion and each of first trace layers are covered by the organic insulating layer; and material of the first trace layer is the first material. The first material is an alloy of one or more of gallium, indium, and tin.

The disclosure also provides a manufacturing method of a display panel, which includes the following steps:

step S1: providing a flexible substrate, and the flexible substrate including: a display portion, a bent portion, and a bezel portion being arranged in order;

step S2: forming a plurality of bent traces on the bent portion, material of the bent traces including a first material, and the first material being a conductive material having a melting point lower than 250° C.; and step S3: bending the bent portion such that the bezel portion and the display portion are stacked.

Each of the bent traces includes a plurality of first trace layers and a plurality of second trace layers; material of the first trace layer is a first material; the step S2 specifically includes:

forming the second trace layers on the bent portion, and covering the bent portion and each of the second trace layers with an organic insulating layer;

providing grooves respectively exposing the two side edges of each of the second trace layers on the organic insulating layer; and forming the first trace layers in the grooves.

Each of the bent traces only includes a plurality of first trace layers; material of the first trace layer is a first material; the step S2 specifically includes:

forming the first trace layers on the bent portion; and covering the bent portion and each of the first trace layers with an organic insulating layer.

The first material is an alloy of one or more of gallium, indium, and tin.

The process of forming the bent traces in step S2 includes one or more combinations of a chemical vapor deposition process, a 3D printing process, and an atomic spray process.

The invention also provides a repair method of a display panel, which is applied to the above display panel and includes the following steps:

heating the bent traces such that first material of the bent traces is melted when the bent traces are broken on the bent portion;

using droplets of the melted first material to flow and fill broken positions of the bent traces; and stopping heating, the first material being solidified, and both ends of the broken traces being reconnected by the first material.

Beneficial effect of the present disclosure: the present disclosure provides a display panel including: a flexible substrate and a plurality of bent traces. The flexible substrate includes a display portion, a bent portion, and a bezel portion being arranged in order. The bezel portion and the display portion are stacked through a bending of the bent portion. The bent portion is provided with the plurality of bent traces. Material of the bent traces includes a first material, and the first material is a conductive material having a melting point lower than 250° C. By adding the first material with the low melting point to the bent traces, when the bent traces are broken, the first material can be melted to flow by heating, thereby repairing the broken traces among the bent traces, whereby realizing the self-repair of the bent traces, increasing the process yield and reducing the production loss. The disclosure also provides a manufacturing method of a display panel and a repair method of a display panel, which can realize self-repair of bent traces, increase the process yield, and reduce production loss.

BRIEF DESCRIPTION OF THE SEVERAL VIEWS OF THE DRAWINGS

Referring to the following detailed description of the present disclosure and the accompanying drawings in order to further understand the features and technical contents of the present disclosure. However, the drawings are provided for reference and explanation only, and are not intended to limit the present disclosure.

In the drawings.

DESCRIPTION OF SPECIFIC EMBODIMENTS OF THE INVENTION

In order to further clarify the technical means adopted by the present disclosure and its effects, the following describes in detail with reference to the preferred embodiments of the present disclosure and the accompanying drawings.

Figure 1:
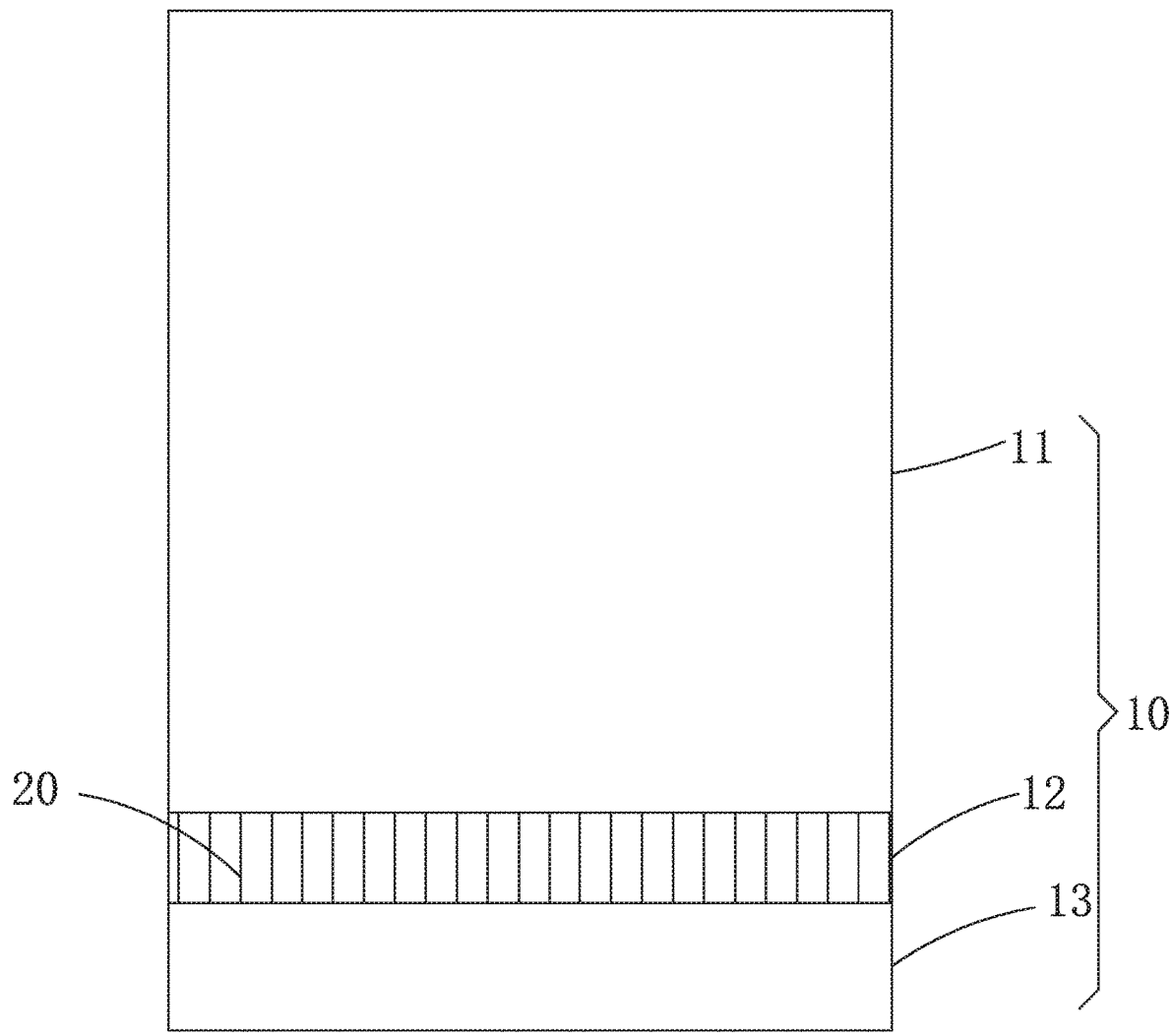
FIG. 1 is a top view of a display panel of the present disclosure.

Referring to FIG. 1, the present disclosure provides a display panel including: a flexible substrate 10 and a plurality of bent traces 20.

The flexible substrate 10 includes: a display portion 11, a bent portion 12, and a bezel portion 13 arranged in order, and the bezel portion 13 and the display portion 11 can be stacked by a bending of the bent portion 12.

The bent portion 12 is provided with a plurality of bent traces 20. Material of the bent traces 20 includes a first material, and the first material is a conductive material having a melting point lower than 250° C.

Figure 2:
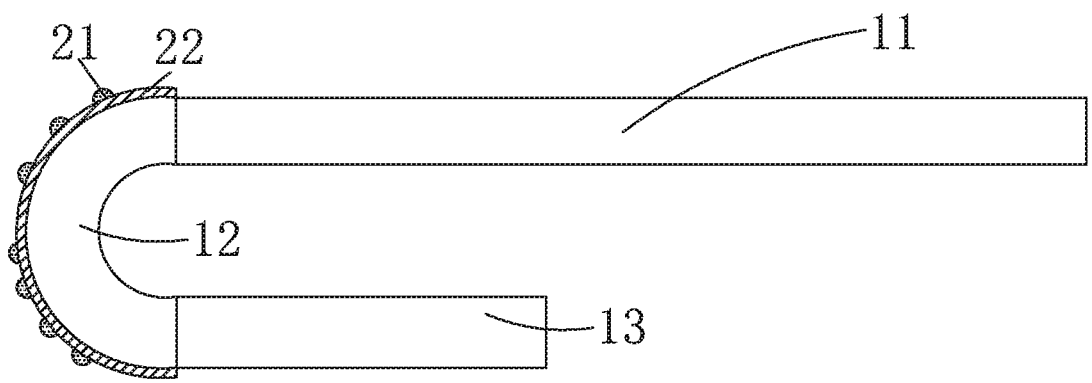
FIG. 2 is a side view of a first embodiment of a display panel of the present disclosure.
Figure 4:
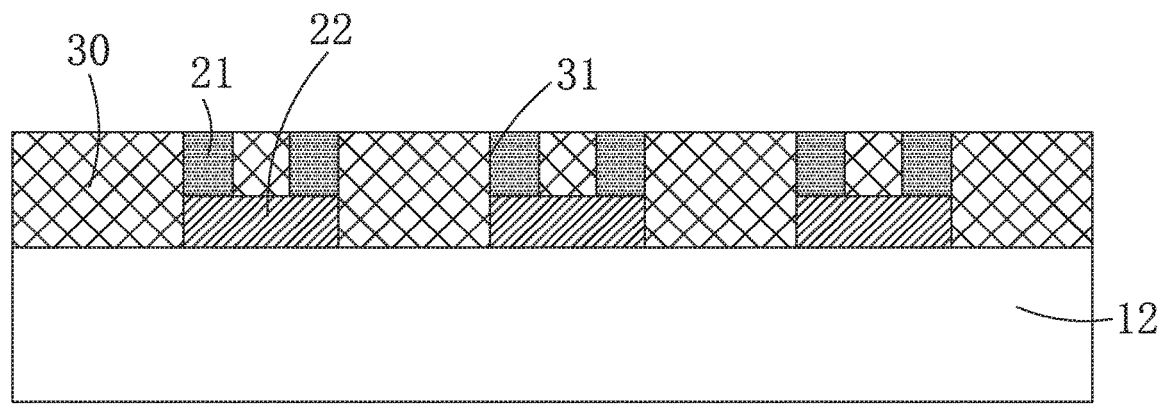
FIG. 4 is a cross-sectional view of a bent portion of a first embodiment of a display panel of the present disclosure.

Specifically, as shown in FIG. 2 and FIG. 4, in the first embodiment of the present disclosure, each bent trace 20 includes a plurality of first trace layers 21 and a plurality of second trace layers 22. The second trace layers 22 are formed in the bent portion 12, and the bent portion 12 and each of the second trace layer 22 are covered by an organic insulating layer 30. The organic insulating layer 30 corresponding to each of the second trace layers 22 is provided with two grooves 31 respectively exposing the two side edges of each of the second trace layers 22. The first trace layers 21 are formed in the grooves 31. Material of the first trace layers 21 is a first material, and material of the second trace layers 22 is a conventional metal trace material, such as an alloy of one or more of molybdenum, aluminum, copper, and titanium.

Figure 8:
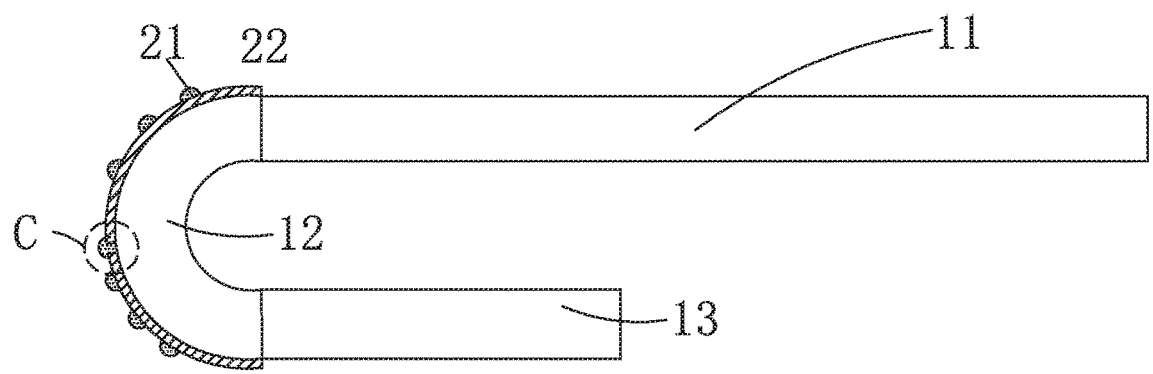
FIG. 8 is a schematic diagram of a first embodiment of a repair method of a display panel of the present disclosure.

During repairing, as shown in FIG. 8, in the first embodiment of the present disclosure, the bent traces 20 are heated when the bent traces 20 are repaired, such that the first material of the bent traces 20 is melt. The heating temperature should be controlled within the range that the display panel can withstand to avoid damaging the performance of other devices in the display panel. The first trace layers 21 are melted by heating to obtain first material droplets, and the first material droplets flow and fill the broken positions C of the bent traces 20. Finally, the heating is stopped, it is restored to the room temperature, the first material is solidified, and both ends of the broken trace of the bent traces 20 are reconnected by the first material.

In the first embodiment of the present disclosure, each of the second trace layers 22 is a continuous conductive line. The first trace layer 21 can be a continuous conductive line covering the second wiring layer 22 as needed and can also be a plurality of conductive blocks arranged at intervals on the second trace layers 22. This will not affect the implementation of the present disclosure.

Further, the first material can be freely selected according to requirements. Preferably, the first material is an alloy of one or more of gallium, indium, and tin.

It should be noted that a crack of the conventional bent trace usually starts from the edge of a trace and gradually extends to the center of the trace. Therefore, preventing and repairing cracks at the edges of the bent traces is a basis for preventing and repairing the fractures of the bent traces. In the first embodiment of the present disclosure, the first trace layers 21 with low melting point disposed on the two side edges of each of the second trace layer 22, so that the edge portion of each of the second trace layers 22 is effectively repaired to ensure the repair effect.

Further, since the bent traces need a strong bent ability, the film thickness thereof should be reduced as much as possible. In this regard, in the first embodiment of the present disclosure, the center portion of each of the second trace layer 22 is not provided with the first trace layers 21, thereby reducing the overall film thickness of the bent traces 10 and ensuring the bent ability of the bent traces.

Furthermore, the first material with a low melting point is prone to cause short circuits during the process of deposition and melting repair. In this regard, in the first embodiment of the present disclosure, the organic insulating layer 30 is disposed on the second trace layers 22 and two grooves 31 are formed in the organic insulating layer 30. The first trace layers 21 are then disposed in the grooves 31, and the flow direction of the first trace layers after being melted is controlled to avoid short-circuit problems during the repair process.

Figure 3:
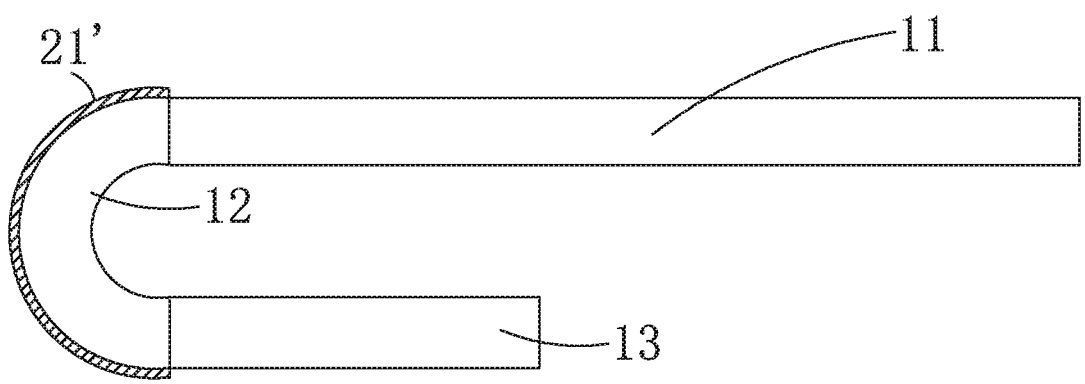
FIG. 3 is a side view of a second embodiment of a display panel of the present disclosure.
Figure 5:
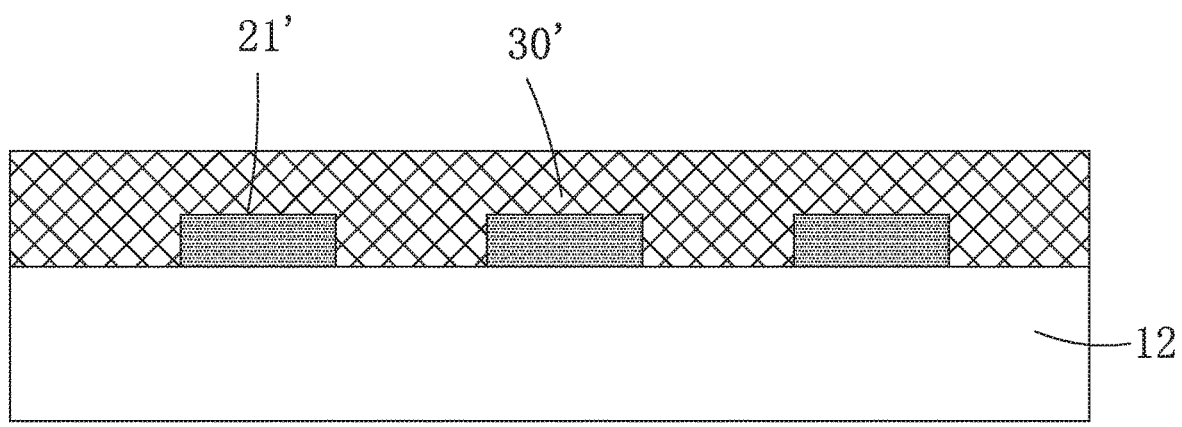
FIG. 5 is a cross-sectional view of a bent portion of a second embodiment of a display panel of the present disclosure.

Specifically, in the second embodiment of the present disclosure, as shown in FIG. 3 and FIG. 5, each of the bent traces 20 includes only a plurality of first trace layers 21', and the first trace layers 21' are formed on the bent portion 12. The bent portion 12 and each of the first trace layers 21' are covered by an organic insulating layer 30'. Material of the first trace layer 21' is the first material. At this time, each of the first trace layers 21' is a continuous conductive line.

Figure 9:
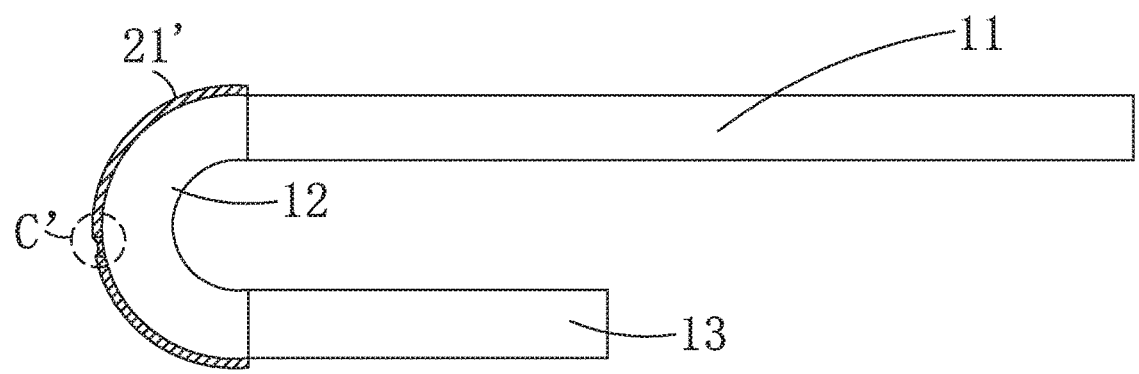
FIG. 9 is a schematic diagram of a second embodiment of a repair method of a display panel of the present disclosure.

During repairing, as shown in FIG. 9, in the second embodiment of the present disclosure, the bent traces 20 are heated when the bent traces 20 are repaired, such that the first material of the bent traces 20 is melt. The heating temperature should be controlled within the range that the display panel can withstand to avoid damaging the performance of other devices in the display panel. The first trace layers 21' are melted by heating to obtain first material droplets, and the first material droplets flow and fill the broken positions C of the bent traces 20. Finally, the heating is stopped, it is restored to the room temperature, the first material is solidified, and both ends of the broken trace of the bent traces 20 are reconnected by the first material.

It should be noted that, since the bent traces need a strong bent ability, the film thickness thereof should be reduced as much as possible. In this regard, in the first embodiment of the present disclosure, the center portion of each of the second trace layer 22 is not provided with the first trace layers 21, thereby reducing the overall film thickness of the bent traces 10 and ensuring the bent ability of the bent traces. Furthermore, the first material with a low melting point is prone to cause short-circuits during the process of deposition and melting repair. In this regard, in the second embodiment of the present disclosure, the organic insulating layer 30 is disposed on the second trace layers 21' and each of the second trace layers 21' is separated through the organic insulating layer 30. The flow direction of the first trace layers 21' after being melted is controlled to avoid short-circuit problems during the repair process.

Figure 6:
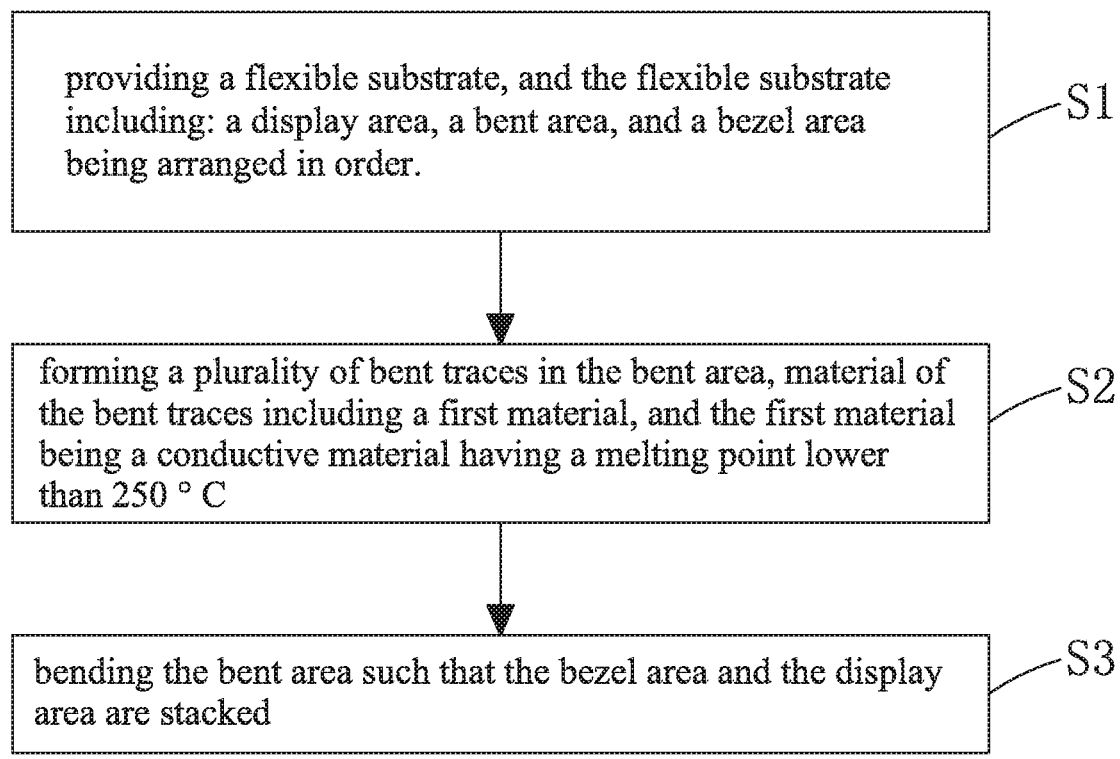
FIG. 6 is a flowchart of a manufacturing method of a display panel of the present disclosure.

Referring to FIG. 6, the present disclosure also provides a manufacturing method of a display panel, including the following steps:

step S1: providing a flexible substrate 10, and the flexible substrate 10 including: a display portion 11, a bent portion 12, and a bezel portion 13 being arranged in order;

step S2: forming a plurality of bent traces 20 on the bent portion 12, material of the bent traces including a first material, and the first material being a conductive material having a melting point lower than 250° C.; and step S3: bending the bent portion 12 such that the bezel portion 13 and the display portion 11 are stacked.

Preferably, the first material is an alloy of one or more of gallium, indium, and tin.

Specifically, in the first embodiment of the present disclosure, each of the bent traces includes a plurality of first trace layers and a plurality of second trace layers; material of the first trace layer is a first material.

The step S2 specifically includes:

forming the second trace layers 22 on the bent portion 12, and covering the bent portion 12 and each of the second trace layers 22 with an organic insulating layer 30;

providing grooves 31 respectively exposing the two side edges of each of the second trace layers 22 on the organic insulating layer 30; and forming the first trace layers 21 in the grooves 31.

Specifically, the material of the second trace layer 22 is a conventional metal trace material, such as an alloy of one or more of molybdenum, aluminum, copper, and titanium. The process of forming the bent traces 20 in step S2 includes one or more combinations of a chemical vapor deposition process, a 3D printing process, and an atomic spray process.

During repairing, as shown in FIG. 8, in the first embodiment of the present disclosure, the bent traces 20 are heated when the bent traces 20 are repaired, such that the first material of the bent traces 20 is melt. The heating temperature should be controlled within the range that the display panel can withstand to avoid damaging the performance of other devices in the display panel. The first trace layers 21 are melted by heating to obtain first material droplets, and the first material droplets flow and fill the broken positions C of the bent traces 20. Finally, the heating is stopped, it is restored to the room temperature, the first material is solidified, and both ends of the broken trace of the bent traces 20 are reconnected by the first material.

In the first embodiment of the present disclosure, each of the second trace layers 22 is a continuous conductive line. The first trace layer 21 can be a continuous conductive line covering the second trace layer 22 as needed and can also be a plurality of conductive blocks arranged at intervals on the second trace layers 22. This will not affect the implementation of the present disclosure.

Further, the first material can be freely selected according to requirements. Preferably, the first material is an alloy of one or more of gallium, indium, and tin.

It should be noted that a crack of the conventional bent trace usually starts from the edge of a trace and gradually extend to the center of the trace. Therefore, preventing and repairing cracks at the edges of the bent traces is a basis for preventing and repairing the fractures of the bent traces. In this regard, in the first embodiment of the present disclosure, the first trace layers 21 with low melting point is disposed on the two side edges of each of the second trace layer 22, so that the edge portion of each of the second trace layers 22 is effectively repaired to ensure the repair effect.

Further, since the bent traces need a strong bent ability, the film thickness thereof should be reduced as much as possible. In this regard, in the first embodiment of the present disclosure, the center portion of each of the second trace layer 22 is not provided with the first trace layers 21, thereby reducing the overall film thickness of the bent traces 10 and ensuring the bent ability of the bent traces.

Furthermore, the first material with a low melting point is prone to cause short-circuits during the process of deposition and melting repair. In this regard, in the first embodiment of the present disclosure, the organic insulating layer 30 is disposed on the second trace layers 22 and two grooves 31 are formed in the organic insulating layer 30. The first trace layers 21 are then disposed in the grooves 31, and the flow direction of the first trace layers after being melted is controlled to avoid short-circuit problems during the repair process.

Specifically, in the first embodiment of the present disclosure, each of the bent traces 20 includes only a plurality of first trace layers 21' and material of the first trace layer 21' is the first material.

The step S2 specifically includes:

forming the first trace layers 21' on the bent portion 12, and covering the bent portion 12 and each of the first trace layers 21' with an organic insulating layer 30'.

The process of forming the first trace layer 21' on the bent portion 12 can be implemented through a chemical vapor deposition process.

During repairing, as shown in FIG. 9, in the second embodiment of the present disclosure, the bent traces 20 are heated when the bent traces 20 are repaired, such that the first material of the bent traces 20 is melt. The heating temperature should be controlled within the range that the display panel can withstand to avoid damaging the performance of other devices in the display panel. The first trace layers 21' are melted by heating to obtain first material droplets, and the first material droplets flow and fill the broken positions C of the bent traces 20. Finally, the heating is stopped, it is restored to the room temperature, the first material is solidified, and both ends of the broken trace of the bent traces 20 are reconnected by the first material.

It should be noted that, since the bent traces need a strong bent ability, the film thickness thereof should be reduced as much as possible. In this regard, in the second embodiment of the present disclosure, only the first trace layers 21' are not provided with the second trace layers 22, thereby reducing the overall film thickness of the bent traces 10 and ensuring the bent ability of the bent traces. Furthermore, the first material with a low melting point is prone to cause short-circuits during the process of deposition and melting repair. In this regard, in the second embodiment of the present disclosure, the organic insulating layer 30 is disposed on the first trace layers 21 and each of the first trace layers is separated through the organic insulating layer 30. The flow direction of the first trace layers 31' after being melted is controlled to avoid short-circuit problems during the repair process.

Figure 7:
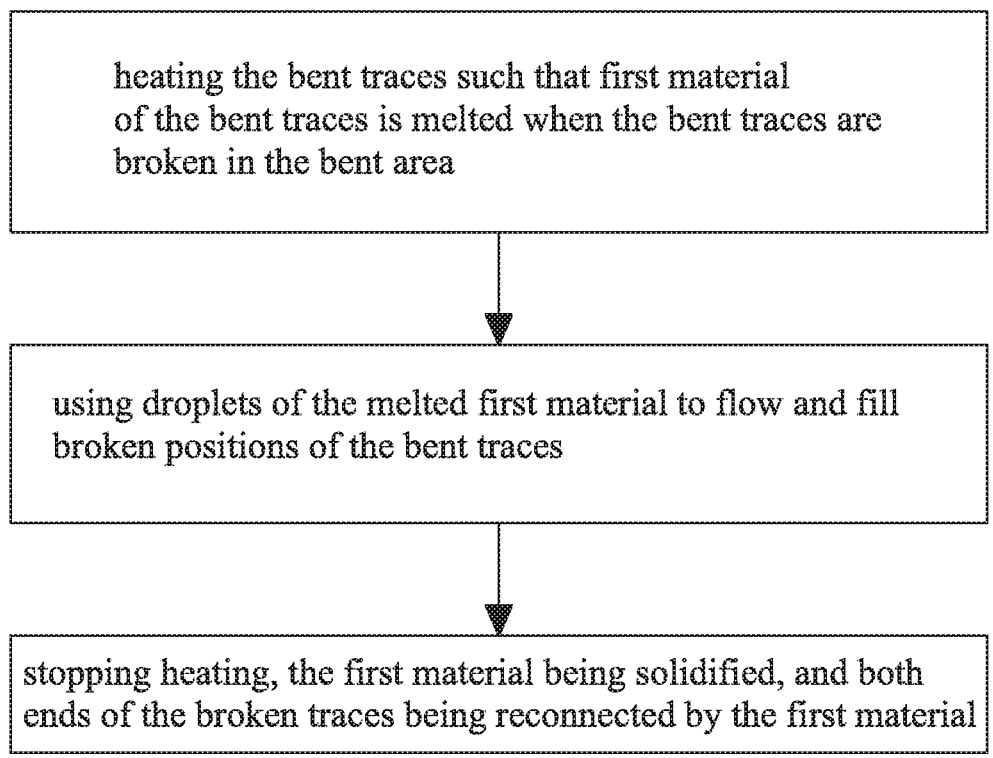
FIG. 7 is a flowchart of a repair method of a display panel of the present disclosure.

As shown in FIG. 7, based on the above display panel, a repair method of the display panel applied to the above display panel includes the following steps:

heating the bent traces 20 such that first material of the bent traces 20 is melted when the bent traces 20 are broken on the bent portion 12;

using droplets of the melted first material to flow and fill broken positions of the bent traces; and stopping heating, the first material being solidified, and both ends of the broken traces being reconnected by the first material.

In summary, the present disclosure provides a display panel including: a flexible substrate and a plurality of bent traces. The flexible substrate includes a display portion, a bent portion, and a bezel portion being arranged in order. The bezel portion and the display portion are stacked through a bending of in the bent portion. The bent portion is provided with the plurality of bent traces Material of the bent traces includes a first material, and the first material is a conductive material having a melting point lower than 250° C. By adding the first material with the low melting point to the bent traces, when the bent traces are broken, the first material can be melted to flow by heating, thereby repairing the broken traces among the bent traces, whereby realizing the self-repair of the bent traces, increasing the process yield and reducing the production loss. The disclosure also provides a manufacturing method of a display panel and a repairing method of a display panel, which can realize self-repair of bent traces, increase the process yield, and reduce production loss.

As described above, various other corresponding changes and modifications can be made according to the technical solutions and technical concepts of the present disclosure for a person of ordinary skill in the art, and all these changes and modifications should fall within the protection scope of the claims of the present disclosure.

What is claimed is:

1. A display panel including comprising:
   a flexible substrate; and
   a plurality of bent traces;
   the flexible substrate including:
   a display portion, a bent portion, and a bezel portion being arranged in the recited order, the bezel portion and the display portion being stacked through a bending of the bent portion;
   the bent portion being provided with the plurality of bent traces, material of the bent traces including a first material, and the first material being a conductive material having a melting point lower than 250° C.;
   wherein each of the bent traces includes a plurality of first trace layers and a second trace layer, the second trace layers are formed on the bent portion, the bent portion and the second trace layers are covered by an organic insulating layer, a portion of the organic insulating layer corresponding to each of the second trace layers is provided with two grooves respectively exposing two opposite side edges of each of the second trace layers, the first trace layers are respectively formed in the grooves, and material of each of the first trace layers is the first material.

2. The display panel as claimed in claim 1, wherein the first material is an alloy of one or more of gallium, indium, and tin.

3. A repair method of a display panel, applied to the display panel claimed in claim 1, comprising the following steps:
   heating the bent traces such that the first material of the bent traces is melted when the bent traces are broken on the bent portion;
   using droplets of the melted first material to flow and fill broken positions of the bent traces; and
   stopping heating, the first material being solidified, and disconnected sections of the broken bent traces being reconnected by the first material.

* * * * *